US009203604B1

(12) United States Patent
Mendel et al.

(10) Patent No.: US 9,203,604 B1
(45) Date of Patent: Dec. 1, 2015

(54) METHODS AND APPARATUS FOR PERFORMING BIT SWAPPING IN CLOCK DATA RECOVERY CIRCUITRY

(71) Applicant: Altera Corporation, San Jose, CA (US)

(72) Inventors: David W. Mendel, Sunnyvale, CA (US); Gregg William Baeckler, San Jose, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 19 days.

(21) Appl. No.: 13/862,305

(22) Filed: Apr. 12, 2013

(51) Int. Cl.
*H04L 7/00* (2006.01)
*H04L 7/033* (2006.01)
*H03L 7/10* (2006.01)
*H04L 1/20* (2006.01)

(52) U.S. Cl.
CPC ............... *H04L 7/0087* (2013.01); *H03L 7/10* (2013.01); *H04L 7/033* (2013.01); *H04L 1/205* (2013.01)

(58) Field of Classification Search
CPC .... H04L 1/205; H04L 7/033; G01R 31/3171; G01R 31/31725; H03L 7/087; H03L 7/00; H03L 7/10
USPC .......... 375/376, 373, 371, 354; 327/100, 141, 327/155, 156; 702/69, 66, 57, 1; 713/503, 713/500
See application file for complete search history.

(56) References Cited

U.S. PATENT DOCUMENTS

| 5,467,464 | A * | 11/1995 | Oprescu et al. | 713/400 |
|---|---|---|---|---|
| 5,579,352 | A * | 11/1996 | Llewellyn | 375/376 |
| 6,463,109 | B1 * | 10/2002 | McCormack et al. | 375/355 |
| 6,519,302 | B1 * | 2/2003 | Bruce et al. | 375/355 |
| 7,424,650 | B1 * | 9/2008 | Sivadasan et al. | 714/700 |
| 8,126,079 | B1 * | 2/2012 | Tran et al. | 375/295 |
| 8,681,839 | B2 * | 3/2014 | Bulzacchelli et al. | 375/220 |
| 2005/0058234 | A1 * | 3/2005 | Stojanovic | 375/371 |
| 2006/0034395 | A1 * | 2/2006 | Evans et al. | 375/326 |
| 2007/0195005 | A1 * | 8/2007 | Schantz | 343/876 |
| 2008/0187036 | A1 * | 8/2008 | Park et al. | 375/233 |
| 2009/0097541 | A1 * | 4/2009 | Aziz et al. | 375/233 |

OTHER PUBLICATIONS

Li et al., U.S. Appl. No. 12/250,465, filed Oct. 13, 2008.
Li et al., U.S. Appl. No. 12/762,848, filed Apr. 19, 2010.
Maximim Integrated, "Precision Reference Clock Usage in Clock and Data Recovery Circuits" Mar. 13, 2003 [Retrieved on Apr. 12, 2013]. Retrieved from the Internet:http://www.maximintegrated.com/app-notes/index.mvp/id/1925.

* cited by examiner

*Primary Examiner* — Chieh M Fan
*Assistant Examiner* — Michelle M Koeth
(74) *Attorney, Agent, or Firm* — Treyz Law Group, P.C.; Jason Tsai (57) ABSTRACT

Integrated circuits with high-speed communications capabilities are provided. Such types of integrated circuits may include clock data recovery (CDR) circuitry. The CDR circuitry may receive incoming data and may generate a recovered clock that is phase-aligned to the incoming data. The CDR circuitry may also include data latching circuitry for separately latching even and odd data bits in alternating clock cycles. During a first mode, a first portion of the data latching circuitry may be used to latch even data bits while a second portion of the data latching circuitry may be used to latch odd data bits. During a second mode, the second portion of the data latching circuitry may be used to latch the even data bits while the first portion of the data latching circuitry may be used to latch the odd data bits. The mode that yields the better link performance may be selected.

20 Claims, 7 Drawing Sheets

METHODS AND APPARATUS FOR PERFORMING BIT SWAPPING IN CLOCK DATA RECOVERY CIRCUITRY

BACKGROUND

This relates generally to communications links, and more particularly, to high-speed input-output (I/O) communications links.

A typical communications link includes a transmitter (TX), a receiver (RX), and a channel that connects the transmitter to the receiver. The transmitter transmits a serial data bit stream to the receiver via the channel. Typical high-speed transmit data rates are 1 Gbps (gigabits per second) to 10 Gbps. Communications links operating at such high data rates are often referred to as high-speed serial links or high-speed input-output links.

Ideally, the transmitter outputs the data bits at even intervals using a transmitter clock signal with 50% duty cycle while the receiver latches incoming serial data bits using latching circuits that have been calibrated to remove any undesired offset.

In practice, however, the transmitter clock signal may suffer from duty cycle distortion (i.e., the transmitter clock signal may exhibit a duty cycle that deviates from 50%), which can cause eye openings associated with even and odd data bits being received at the receiver to be different in size (i.e., the eye opening associated with the even data bits may be smaller than the eye opening associated with the odd data bits, or vice versa). Moreover, a first latching circuit that is being used to latch even data bits and a second latching circuit that is being used to latch odd data bits may exhibit non-zero offset even after offset calibration.

The first and second latching circuits sometimes exhibit different residual offset. When data bits exhibiting the smaller eye are being latched using one of the two latching circuits exhibiting poorer offset characteristics, the performance of the communications link will be substantially degraded.

SUMMARY

Methods and apparatus for performing bit swapping (also referred to as clock rerouting or clock inversion) in high-speed communications systems are provided. An integrated circuit in a high-speed communications system may be used to receive incoming data bits over a communications channel. The integrated circuit may include clock data recovery (CDR) circuitry that is used to generate a recovered clock signal based on the incoming data bits and data latching circuitry for capturing the incoming data bits using the recovered clock signal.

The integrated circuit may be placed in a first mode during which the data latching circuits capture the incoming data bits using the recovered clock signal and a second mode during which the data latching circuits capture the incoming data bits using an inverted version of the recovered clock signal. For example, the data latching circuitry may include a first data latch that is used to latch "even" data bits in the incoming data bits during the first mode and to latch "odd" data bits in the incoming data bits during the second mode. The data latching circuitry may also include a second data latch that is used to latch the odd data bits during the first mode and to latch the even data bits during the second mode.

In one suitable arrangement, the CDR circuitry may include a phase-locked loop and a phase detector that are used to generate the recovered clock signal. In this arrangement, the data latching circuitry may further include clock rerouting circuits and data reordering circuits. For example, the data latching circuitry may include first and second multiplexers that serve to route the recovered signal during the first the second modes. During the first mode, the first multiplexer may be used to route the recovered clock signal to the first data latch while the second multiplexer may be used to route the inverted version of the recovered clock signal to the second data latch. During the second mode, the first multiplexer may be used to route the inverted version of the recovered clock signal to the second data latch while the second multiplexer may be used to route the recovered clock signal to the first data latch. The data bit reordering circuitry may be used to swap the order of the data bits that are being latched by the first and second data latches.

In another suitable arrangement, the CDR circuitry may include a phase-locked loop, a phase detector, and a phase interpolator that are used to generate the recovered clock signal. The integrated circuit may also include CDR control circuitry that controls the phase interpolator using a control signal. During the first mode, the control signal is deassetted and the phase interpolator is configured to output the recovered clock signal to the data latching circuitry. During the second mode, the control signal is asserted and the phase interpolator is configured to output the inverted version of the recovered clock signal to the data latching circuit In either arrangement, the integrated circuit may include offset calibration circuitry that is coupled to the data latching circuitry and that serves to perform voltage offset cancelation on the data latching circuitry (e.g., to remove any preexisting voltage offset in the first and second data latches). The integrated circuit may also include an eye quality monitoring circuit that is coupled to the data latching circuitry. The eye quality monitoring circuit may be used to obtain a first link performance measurement while the data latching circuitry is capturing incoming data bits during the first mode and may be used to obtain a second link performance measurement while the data latching circuitry is capturing incoming data bits during the second mode. The first link performance measurement may be compared to the second link performance measurement to determine whether to place the CDR circuitry in a selected one of the first and second modes during normal device operation of the integrated circuit.

Further features of the present invention, its nature and various advantages will be more apparent from the accompanying drawings and the following detailed description.

DETAILED DESCRIPTION

Embodiments of the present invention relate to communications links, and more particular, to methods for improving the performance of communications links. It will be recognized by one skilled in the art, that the present exemplary embodiments may be practiced without some or all of these specific details. In other instances, well-known operations have not been described in detail in order not to unnecessarily obscure the present embodiments.

Communications links are commonly used to transport data between separate integrated circuits packages, printed circuit boards, etc. Such communications links may be used to connect integrated circuits that include communications capabilities, such as memory chips, digital signal processing circuits, microprocessors, application specific integrated circuits, programmable logic device integrated circuits, field-programmable gate arrays, application specified standard products, or any other suitable integrated circuit.

Figure 1:
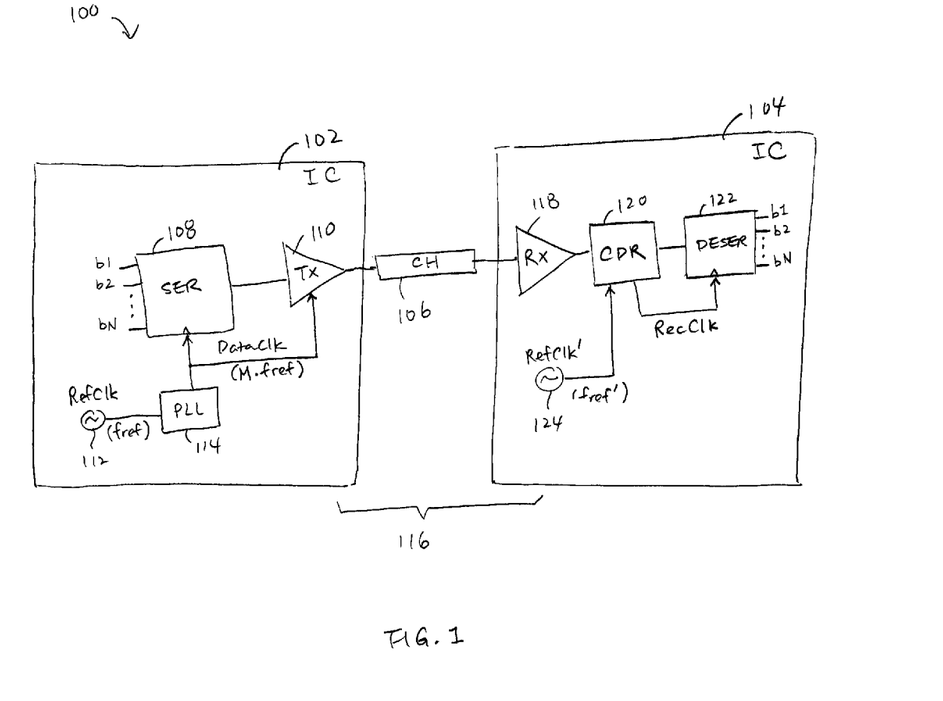
FIG. 1 is a circuit block diagram of an illustrative communications link in accordance with an embodiment of the present invention.

A high-speed link might, as an example, carry data at 10 gigabits per second. A high-speed communications system is shown in FIG. 1. Communications system 100 may include transmitter (TX) circuitry such as TX circuitry 102, a channel such as channel 106, and receiver (RX) circuitry such as RX circuitry 104. Channel 106 may connect TX circuitry 102 to RX circuitry 104 (e.g., circuitry 102 may produce data that is to be transmitted to circuitry 104 over link 116).

TX circuitry 102 may be formed on a first integrated circuit while RX circuitry 104 may be formed on a second integrated circuit (as an example). Integrated circuit devices 102 and 104 may be mounted on a printed circuit board (PCB). Transmitter circuitry 102 may convey data to RX circuitry 104 through channel 106. If desired, more than one channel may be used to link TX circuitry 102 to RX circuitry 104.

Channel 106 may be formed from any suitable physical transmission medium. Examples of transmission paths that may be used in channel 106 include differential signaling paths made up of pairs of conductive wires, coaxial cable paths (e.g., a CAT 5 cable), fiber optic cable paths, traces on printed circuit boards, combinations of such paths, backplane connectors, or other suitable communications link paths. In a typical system, integrated circuits 102 and 104 may be mounted on one or more circuit boards and channel 110 may involve transmission line structures fabricated on the circuit board or boards.

This example is merely illustrative. Communications link of the type described in connection with FIG. 1 may be used provide data transport between integrated circuits, printed circuit boards, circuits within a single integrated circuit, etc.

In the example of FIG. 1, integrated circuit 102 contains a transmitter 110 and integrated circuit 104 contains a corresponding receiver 118. A single channel 106 is used to connect transmitter 108 to receiver 112. This is merely illustrative. If desired, integrated circuit 102 may contain multiple transmitters such as transmitter 110, whereas integrated circuit 104 may contain multiple corresponding receivers such as receiver 118. Multiple communications paths may be used to link the transmitters and receivers. Integrated circuit 102 may also include one or more receivers that receive data from one or more corresponding transmitters on integrated circuit 104. Data may also be conveyed to and from additional integrated circuits using transmitters and receivers such a transmitter 110 and receiver 118.

Transmitter circuitry 102 may also include a serializer circuit such as serializer 108, a TX phase-locked loop (PLL) such as phase-locked loop 114, and a TX clock generator such as oscillator 112. Serializer 108 may be used to convert parallel data bits b1-bN into a serial bit stream for data transmission.

The serial data bit stream may be fed to transmitter 110 for transmission over channel 106. Transmitter 110 may include a TX equalizer circuit and a TX data driver circuit. The equalizer may be used to provide high-frequency and direct signal level boosting to compensate for high-frequency signal loss commonly seen in high-speed serial links (e.g., losses in copper-based channels that exhibit undesired low-pass transfer characteristics that result in signal degradation at high data rates) or to enhance signal to noise ratio (SNR) in scenarios in which uncorrelated noise such as crosstalk is present.

The TX equalizer may output equalized data to the TX driver. The TX driver may have an output that is connected to a first terminal of channel 106. The output of the TX driver may have an output differential resistance of 100 Ohms to provide impedance matching with channel 106 (e.g., the first terminal of channel 106 may have an input differential resistance of 100 Ohms). The TX driver may be used to provide sufficient drive strength to drive the serial data stream across channel 106.

Phase-locked loop 114 may receive a reference clock signal RefClk having a frequency fref from oscillator 112. Oscillator 112 may be an off-chip crystal oscillator (as an example). If desired, signal RefClk may be provided from an off-chip oscillator. Phase-locked loop 114 may be used to produce a desired transmit data clock signal DataClk to control data serializer 108 and transmitter 110. Transmit control signal DataClk may exhibit a frequency that is an integer multiple of the frequency of RefClk (e.g., DataClk may have a frequency that is equal to M*fref, where M is any suitable integer).

For example, consider a scenario in which signal RefClk has a clock rate of 500 MHz. The data clock signal DataClk may have a transmit clock rate of 2 GHz, 2.5 GHz, 5 GHz, 18 GHz, etc. In one suitable arrangement, TX circuitry 102 may transmit the serial data bit stream with a transmit data rate that is equivalent to the clock rate of signal DataClk. Consider a scenario in which the transmit clock rate is equal to 15 GHz. In this scenario, transmitter 110, which is controlled by DataClk, will transmit data at a transmit data rate of 15 Gbps. In another suitable arrangement sometimes referred to as a half-rate transmission architecture, data can be transmitted at 30 Gbps if both riding and falling edges of signal DataClk are used to clock the data. Embodiments of the present invention generally relate to such types of half-rate transceiver systems.

Channel 106 may have a second terminal that is connected to receiver 118 in RX circuitry 104. Circuitry 104 may also include clock data recovery (CDR) circuitry such as CDR circuitry 120, a deserializer circuit such as deserializer 122, and an RX clock generator such as oscillator 124. Receiver 113 may include an RX buffer circuit and an RX equalizer circuit. The RX buffer circuit may receive data from channel 106. The RX buffer may have an input differential resistance of 100 Ohms for impedance matching (e.g., the second terminal of channel 66 has an output differential resistance of 10

Ohms). The RX buffer may provide additional pre-amplification for the received data, if desired. The RX buffer may output the received data bits the RX equalizer. The RX equalizer may provide further high-frequency boosting or direct signal level boosting to compensate for any additional undesired high-frequency signal loss.

Receiver 118 may provide the received data bits to CDR circuitry 120. Clock data recovery circuitry 120 may receive a local reference clock signal RefClk' from oscillator 124. Signal RefClk' may exhibit a frequency fref' that is substantially equal to frequency fref of TX reference clock RefClk. Oscillator 124 may be an off-chip crystal oscillator (as an example). If desired, signal RefClk' may be generated by an off-chip clock source. Clock data recovery circuitry 120 may be used to generate a recovered data clock signal based on the received data (e.g., CDR circuitry 120 may generate a recovered clock signal that is in phase with the incoming data bits). As an example, CDR circuitry 120 may include a phase-locked loop that receives signal RefClk' and that generates a corresponding recovered clock signal.

Consider a scenario in which the data rate of the received data is 30 Gbps and the clock rate of signal RefClk' is 500 MHz. Assuming a half-rate transmission scheme, CDR circuitry 120 may use its PLL to generate a recovered data clock signal RecClk having a clock rate that is equal to 15 GHz (e.g., the recovered clock may have a clock rate that is equal to half of the data rate of the received data). The recovered data clock signal may also be used to control deserializer 122. Deserializer 122 may serve to convert the serial data bit stream back into parallel bits. Deserializer may also include data latching circuits for latching the received data bits. The data latching circuits may sometimes be considered to be part of clock data recovery circuitry 120.

All the components in system 100 may be implemented using differential architectures. For example, transmitter 110 and receiver 118 may have differential inputs and differential outputs instead of single-ended inputs and outputs. Similarly, the data transmitted over channel 106 may be in the form of differential signals.

Data signals that are being conveyed from device 102 to device 104 via link 116 may be characterized by an overall link metric. The overall link metric may be a bit error rate (BER), as an example. Bit error rate may be defined as the ratio of the number of error bits (e.g., received bits that have been corrupted by noise, jitter, interference, etc.) to the total number of transmitted bits within a given time period.

For example, consider a scenario in which two terabits were transmitted within five seconds. There may be two incorrect bits that were transferred erroneously. The BER is therefore $10^{-12}$ (2 divided by $2*10^{12}$). For high-speed communications system such as system 100, it may be desirable to set the BER to $10^{-12}$ or smaller (e.g., $10^{-13}$, $10^{-15}$, $10^{-18}$, etc.).

Figure 2:
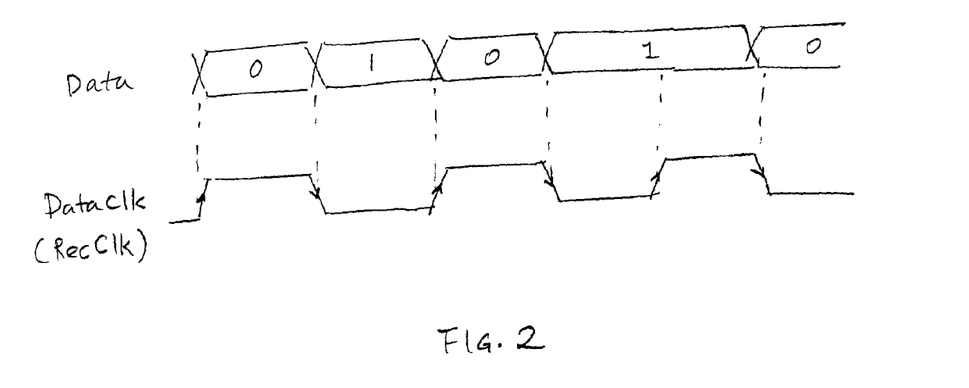
FIG. 2 is a diagram showing a half-rate data transmission scheme in accordance with an embodiment of the present invention.

FIG. 2 is a diagram showing an illustrative serial data bit stream that can be transmitted via channel 106. A half-rate transceiver arrangement is shown in FIG. 2 in which the serial data bit stream having data bits "010110 . . ." toggles at each rising and falling edge of transmit clock signal DataClk. As shown in FIG. 2, the recovered clock signal RecClk should be substantially similar to DataClk (e.g., RecClk should exhibit the same frequency as DataClk and should have edges that are phase aligned to the data bit transitions).

Figure 3:
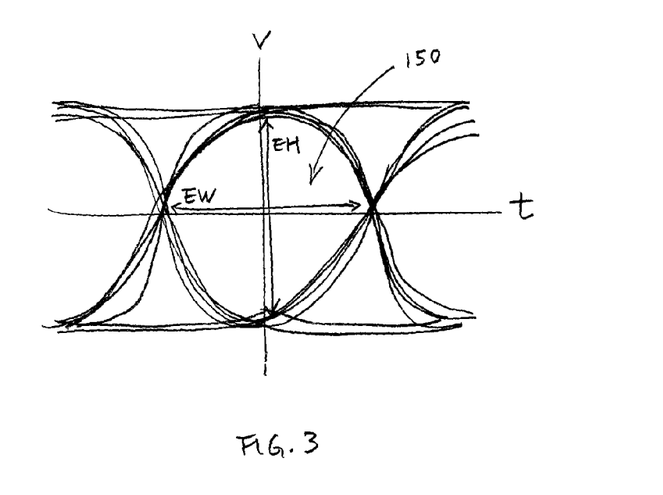
FIG. 3 is an eve diagram of an illustrative data stream in accordance with an embodiment of the present invention.

FIG. 3 shows an exemplary eye diagram of the transmitted data bits. The eye diagram may be formed by repetitively sampling the incoming data bits at regular time intervals and by overlaying the sampled information. As shown in FIG. 3, the eye diagram displays an eye opening 150 that is characterized by an eye width EW and an eye height EH. Ideally, the eye width is equal to half the clock period of signal DataClk (assuming a half-rate data transmission architecture), whereas the eye height is equal to the full rail differential voltage swing. In practice, however, jitter, noise, variations in operating voltage, variations in operating temperature, and other sources of random variation may reduce the size of eye opening 150. As an example, jitter may cause variation in time, which degrades eye width EW. As another example, noise may cause variation in voltage, which degrades eye height EH.

Figure 4:
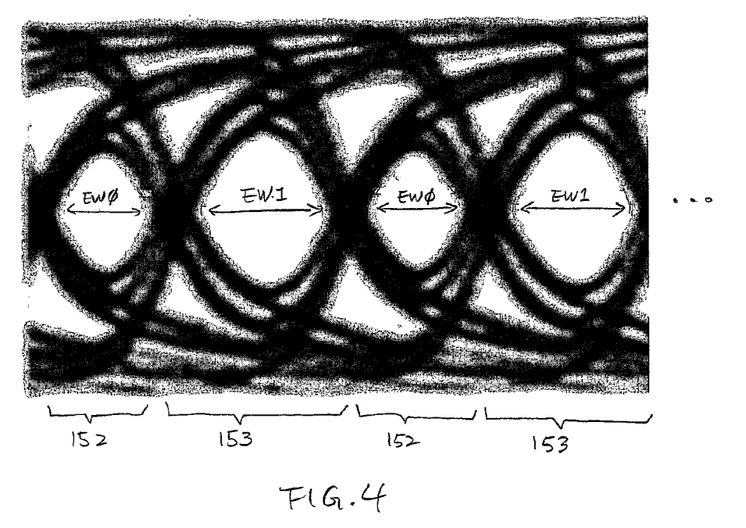
FIG. 4 is a diagram showing how duty cycle distortion can cause eye openings associated with even and odd data bits to be different in size in accordance with an embodiment of the present invention.

FIG. 4 illustrates a scenario in which signal DataClk that is used for controlling transmitter 110 suffers from duty cycle distortion (DCD). Data bits that are transmitted in response to rising edges of DataClk may sometimes be referred to as "even" data bits, whereas data bits that are transmitted in response to falling edges of DataClk may be referred to as "odd" data bits.

As shown in FIG. 4, duty cycle distortion in DataClk may result in eye openings associated with even data bits 152 to be different in size compared to eye openings associated with odd data bits 153. In the particular example of FIG. 4, even data bit eye openings 152 are smaller than odd data bit eye openings 153 (e.g., eye width EW0 of even data bit eye openings 152 are less than eye width EW1 of odd data bit eye openings 153). This may be the case when the duty cycle of DataClk being high is less than 50%. In scenarios in which the duty cycle of DataClk being high is greater than 50%, the even data bit eye openings 152 may be larger than odd data bit eye openings 153 (e.g., eye width EW0 of even data bit eye openings 152 may be greater than eye width EW1 of odd data bit eye openings 153). In general, data bits with smaller eye openings are more difficult to latch than data bits with larger eye openings. In other words, data bits associated with smaller eye openings exhibit higher bit error rates than that of data bits associated with larger eye openings.

Figure 5:
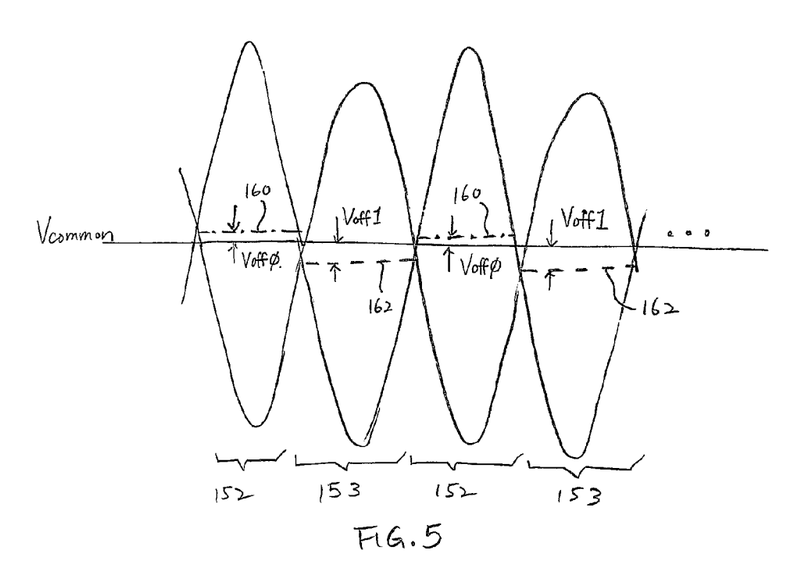
FIG. 5 is a diagram showing the need for data latching circuits to exhibit respective non-centered offset for separately latching even and odd data bits in accordance with an embodiment of the present invention.

FIG. 5 illustrates a scenario in which the transmit driver in transmitter 110 suffers from rise-fall skew (e.g., the transmit driver exhibits mismatched rise times and fall times). As an example, the transmit driver may exhibit stronger pull-down drive strength relative to its pull-up drive strength, thereby causing the fall times to be relative shorter than the rise times. As another example, the transmit driver may exhibit stronger pull-up drive strength relative to its pull-down drive strength, thereby causing the fall times to be relative longer than the rise times.

As shown in FIG. 5, rise-fall time skew in the transmit driver may result in eye openings associated with even data bits 152 to have a voltage offset amount that is different than that of eye openings associated with odd data bits 153. In the particular example of FIG. 5, even data bit eye openings 1532 are vertically offset with respect to nominal voltage center level Vcommon by offset amount Voff0 (as indicated by positive offset 160), whereas odd data bit eye openings 153 are vertically offset with respect to Vcommon by offset amount Voff1 (as indicated by negative offset 162). In other scenarios, it is also possible that even data bit eye openings 152 exhibit a negative voltage offset while odd data bit eye openings 153 exhibit a positive voltage offset. In yet other suitable scenarios, it is possible that the even and odd eye openings exhibit the same or different voltage offsets, each of which can be positive or negative voltage offset amounts relative to ideal center level Vcommon.

In general, receiver circuitry 104 (see, e.g., FIG. 1) may contain separate storage circuits for latching even and odd data bits. For example, circuitry 104 may contain a first data latching circuit for receiving and latching incoming even data bits and a second data latching circuit for receiving and latching incoming odd data bits. These data latching circuits may be calibrated during device startup to remove any pre-existing voltage offset using any voltage offset calibration technique that is well known in the art. Performing voltage offset calibration in this way, however, does not guarantee that voltage offset is absent during normal operation of system 100. Due to quantization effects of calibration, or simply calibration error, there may be residual voltage offset that remains even after performing the startup voltage offset calibration operation. Oftentimes, the residual offset may be different for the first and second data latching circuits that are being used to latch the incoming data bits.

In general, the data latching circuit with the smaller residual offset is considered to be better calibrated than the data latching circuit with the larger residual offset (i.e., the data latching circuit with the smaller residual offset is considered to exhibit better offset cancellation). As a result, it may be desirable to use data latching circuits having the smaller residual offset to latch data bits with smaller eye openings and to use data latching circuits having the larger residual offset to latch data bits with larger eye openings (e.g., it is generally desirable to be able to receive bits having the smaller eye opening using the data latching circuit with the better offset cancellation).

Figure 6:
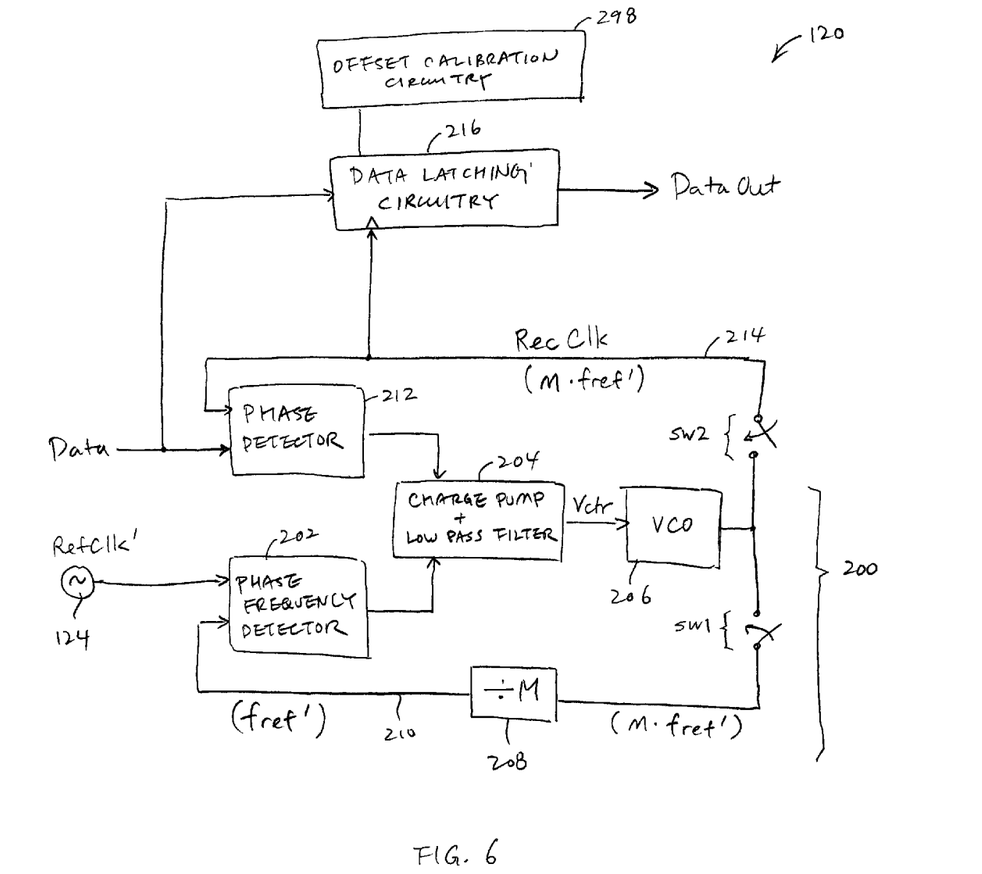
FIG. 6 is a diagram of illustrative analog clock data recovery circuitry in accordance with an embodiment of the present invention.

FIG. 6 shows one suitable arrangement of CDR circuitry 120. As shown in FIG. 6, circuitry 120 may include data storage circuitry such as data latching circuitry 216, latch calibration circuitry such as offset calibration circuitry 298, a phase frequency detector (PFD) circuit such as PFD 202, charge pump and low pass filter circuitry 204, a voltage-controlled oscillator (VCO) circuit such as VCO 206, a divider circuit such as frequency divider 208, a phase detector (PD) circuit such as phase detector 212, and switches SW1 and SW2.

Charge pump and low pass filter circuitry 204 may output a control signal Vctr that controls VCO 206. Voltage-controlled oscillator 206 may have an output on which a signal having a frequency that depends on the value or magnitude of Vctr is provided. The output of VCO 206 may be fed back to an input of PFD 202 via switch SW1 and frequency divider 206. In particular, PFD 202 has a first input that receives signal RefClk' from clock source 124, a second input that is coupled to frequency divider 208 via path 210, and an output that is coupled to circuitry 204. In the example of FIG. 6, frequency divider circuit 208 may be used to provide a division factor that is equal to M. Factor M need not be identical to that being implemented by TX PLL 114 (see, e.g., FIG. 1).

Circuitry 204, VCO 206, divider 208, and PFD 202 may be coupled in a closed loop configuration by turning on switch SW1 and may collectively be referred to as a phase-locked loop (PLL) 200. Phase frequency detector 202 may serve to compare the frequency and phase of the signals presented at its first and second inputs and to generate a corresponding signal at its output to adjust circuitry 204 accordingly. Operated in this way, PFD 202 may be used to ensure that the signal at its second input exhibits a frequency and phase that is equal to that of signal RefClk' (e.g., the signal output by divider 208 may have a frequency that is equal to fref' and a phase that is aligned with RefClk'). As a result, VCO 206 may be configured to output a signal having a frequency that is locked to M*fref'.

Still referring to FIG. 6, the output of VCO 206 may be fed back to an input of PD 212 via switch SW2. In particular, PD 212 may have a first input that receives data bits Data from receiver 118 (FIG. 1), a second input that is coupled to switch SW2 via path 214, and an output that is coupled to circuitry 204. Phase detector 212 may serve to compare only the phase of the signals presented at its first and second inputs and to generate a corresponding signal at its output to adjust circuitry 204 accordingly.

Operated in this way, PD 212 may be used to ensure that the signal at its second input (i.e., the recovered clock signal RecClk) is in-phase with the incoming data (e.g., to adjust signal RecClk so that RecClk exhibits a frequency that is locked to M*fref' and rising/falling clock edges that are aligned to the data bit transitions). Switch SW1 may be activated during a first (frequency-phase locking) time period, whereas switch SW2 may be activated during a second (data-phase aligning) time period (e.g., only one of switches SW1 and SW2 should be turned on at any given point in time). Switch SW2 should only be turned on after PLL 20 has been activated to lock the output of VCO 206 to desired frequency M*fref'. Clock data recovery circuitry 120 of the type shown in FIG. 6 is sometimes referred to as a PLL-based or "analog" CDR circuitry.

Data latching circuitry 216 may have an input that receives data bits Data, a clock input that receives recovered clock signal RecClk, and an output on which latched data bits DataOut are presented. Data latching circuitry 216 may include data registers (e.g., positive-edge-triggered flip-flops and/or negative-edge-triggered flip-flops), level sensitive latches (e.g., pulse latches), or other clocked storage elements for latching incoming data at both rising and falling clock edges of RecClk (assuming a half rate transmission architecture).

As described above, data latching circuitry 216 may include separate data latching circuits each of which are used to latch even and odd data bits, respectively. For example, offset calibration circuitry 298 may be used during device startup to calibrate a first data latching circuit (also referred to as an "even" data bit latching circuit) and a second data latching circuit (also referred to as an "odd" data bit latching circuit) in circuitry 216 to cancel out any preexisting offset in the even and odd data latching circuits. Ideally, the even and odd data latching circuits will exhibit zero offset after calibration circuitry 298 has performed the offset cancelation operations.

In practice, however, the even and odd data bit latching circuits may exhibit non-negligible residual offset even after performing the offset cancelation (e.g., the data latching circuits may exhibit voltage sampling midpoints that deviate from the calibrated baseline). Moreover, the locally generated recovered clock signal RecClk may suffer from duty cycle distortion. In general, it may be desirable to latch data bits exhibiting smaller eye openings using the data latching circuit with the lesser residual offset, using the data latching circuit that is clocked by the falling clock edge of RecClk (if the duty cycle of RecClk being high is greater than 50%), or using the data latching circuit that is clocked by the rising clock edge of RecClk (if the duty cycle of RecClk being high is less than 50%). In other words, it may be desirable to latch data bits associated with larger eye openings using the data latching circuit with the larger residual offset, using the data latching circuit that is clocked by the rising clock edge of RecClk (if the duty cycle of RecClk being high is greater than 50%), or using the data latching circuit that is clocked by the falling clock edge of RecClk (if the duty cycle of RecClk being high is less than 50%). Alternatively, it may be desirable to latch the data bits associated with the larger eye opening with the edge of RecClk associated with the larger duty cycle.

One way of ensuring that the incoming even and odd data bits are paired with the desired latching circuits is to perform data bit swapping and determining which one of the original versus the swapped configuration provides the better link performance.

Figure 7:
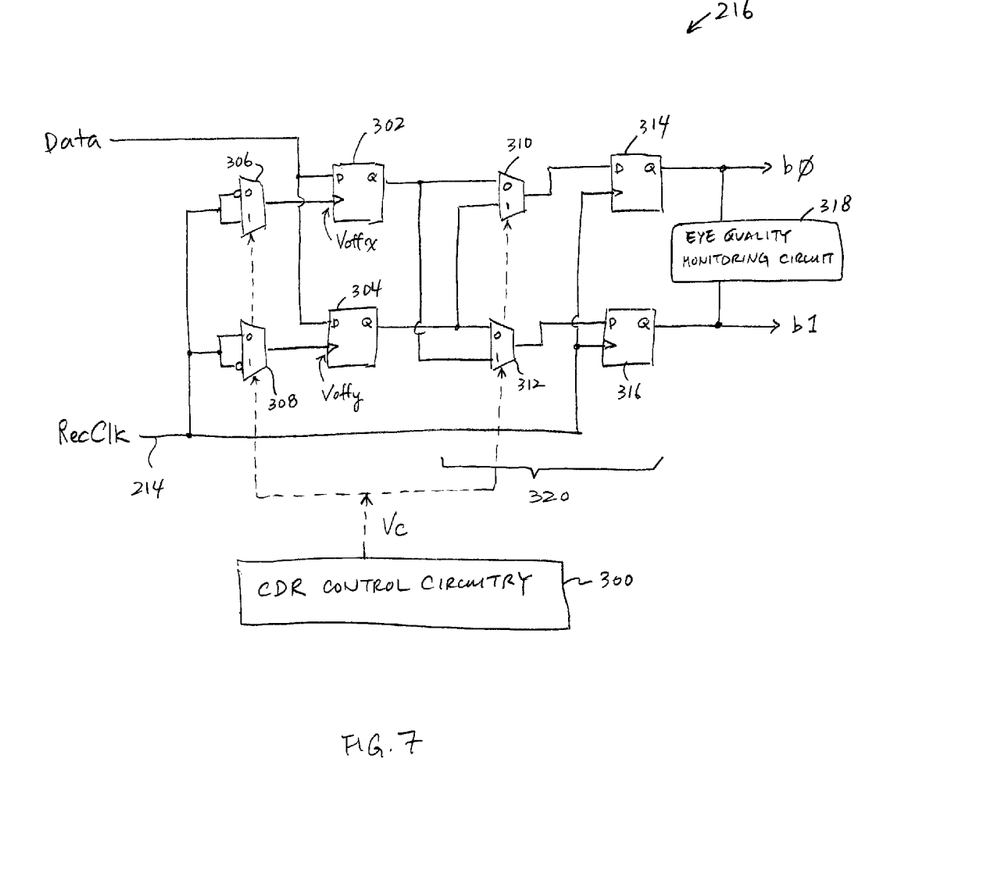
FIG. 7 is a diagram illustrating one suitable circuit implementation for swapping data bits in accordance with an embodiment of the present invention.

FIG. 7 shows one suitable arrangement of data latching circuitry 216 having bit swapping capabilities. As shown in FIG. 7, data latching circuitry 216 may include latching circuits such as latching circuits 302, 304, 314, and 316 (e.g., edge-triggered flip-flop circuits), multiplexing circuits such as multiplexers 306, 308, 310, and 312, a link performance monitoring circuit such as eye quality monitoring circuit 318, and control circuitry such as CDR control circuitry 300.

Multiplexer 306 may have a first (inverting) input and a second (non-inverting) input that receives RecClk via path 214, a control input that receives signal Vc from control circuitry 300, and an output on which a corresponding output clock signal is provided to latch 302. Multiplexer 304 may have a first (non-inverting) input and a second (inverting) input that receives RecClk, a control input that receives signal Vc, and an output on which a corresponding output clock signal is provided to latch 304. Latch 302 may have a data input D that receives incoming data signals Data from receiver 118, a data output Q, and a clock input that receives a clock signal from the output of multiplexer 306. Latch 304 may have a data input D that receives incoming data signals Data from receiver 118, a data output Q, and a clock input that receives a clock signal from the output of multiplexer 308.

Multiplexer 310 may have a first ("0") input that is coupled to the data output of latch 302, a second ("1") input that is coupled to the data output of latch 304, a control input that receives signal Vc, and an output on which corresponding data signals are routed to latch 314. Multiplexer 312 may have a first ("0") input that is coupled to the data output of latch 304, a second ("1") input that is coupled to the data output of latch 302, a control input that receives signal Vc, and an output on which corresponding data signals are routed to latch 316. Latch 314 may have a data input D that receives data signals routed from multiplexer 310, a data output Q on which latched even bits b0 are presented, and a clock input that receives RecClk via path 214. Latch 316 may have a data input D that receives data signals routed from multiplexer 312, a data output Q on which latched odd bits b1 are presented, and a clock input that receives RecClk.

During a first (non-swapped) latching configuration, control circuitry 300 may drive Vc low so that each of multiplexers 306, 308, 310, and 312 route signals from its first input to its respective output. During a second (swapped) latching configuration, control circuitry 300 may drive Vc high so that each of multiplexers 306, 308, 310, and 312 route signals from its second input to its respective output.

Controlling the multiplexing circuits in this way effectively enables clocked storage circuits 302 and 304 to respectively latch odd and even data bits when Vc is low (i.e., when Vc is deasserted) and to respectively latch even and odd data bits when Vc is high (i.e., when Vc is asserted). In order words, multiplexers 306 and 308 and data latching circuits 302 and 304 can be used to perform data bit swapping and are therefore sometimes referred to collectively as bit swapping circuitry. Circuitry 320 (including multiplexers 310 and 312 and data latching circuits 314 and 316) serve to reorder the data bits captured by latches 302 and 304 only when Vc is asserted and is therefore sometimes referred to as bit reordering circuitry.

As shown in the example of FIG. 7, data latching circuit 302 may exhibit a first residual offset amount Voffx while data latching circuit 304 may exhibit a second residual offset amount Voffy. Residual offset amounts Voffx and Voffy can be equal. Consider, however, a scenario in which Voffx is greater than Voffy (i.e., latch 302 exhibits worse offset than latch 304). During the first latching configuration (e.g., when Vc is set to logic "0"), eye quality monitoring circuit 318 that is connected to the output terminals of circuitry 216 may be used to obtain a first link performance measurement. During the second latching configuration (e.g., when Vc is set to logic "1"), eye quality monitoring circuit 318 may be used to obtain a second link performance measurement.

If the incoming even data bits exhibit an eye opening that is larger than that of the incoming odd data bits, then the second link performance measurement will be more favorable than the first link performance measurement (e.g., it is desirable to use the data latching circuit with the worse offset to latch data with the larger eye opening), so the second latching configuration should be selected for use during normal device operation. On the other hand, if the incoming odd data bits exhibit an eye opening that is larger than that of the incoming even data bits, then the first link performance measurement will be greater than the second link performance measurement, so the first latching configuration should be selected for use during normal device operation. Measurements made by eye quality monitoring circuit 318 are therefore used to determine which of the first and second latching configurations yields the better link performance. Monitoring circuit 318 may be used to measure bit error rates, eye width W, eye height H, and/or other desired high-speed communications link performance metrics.

Figure 8:
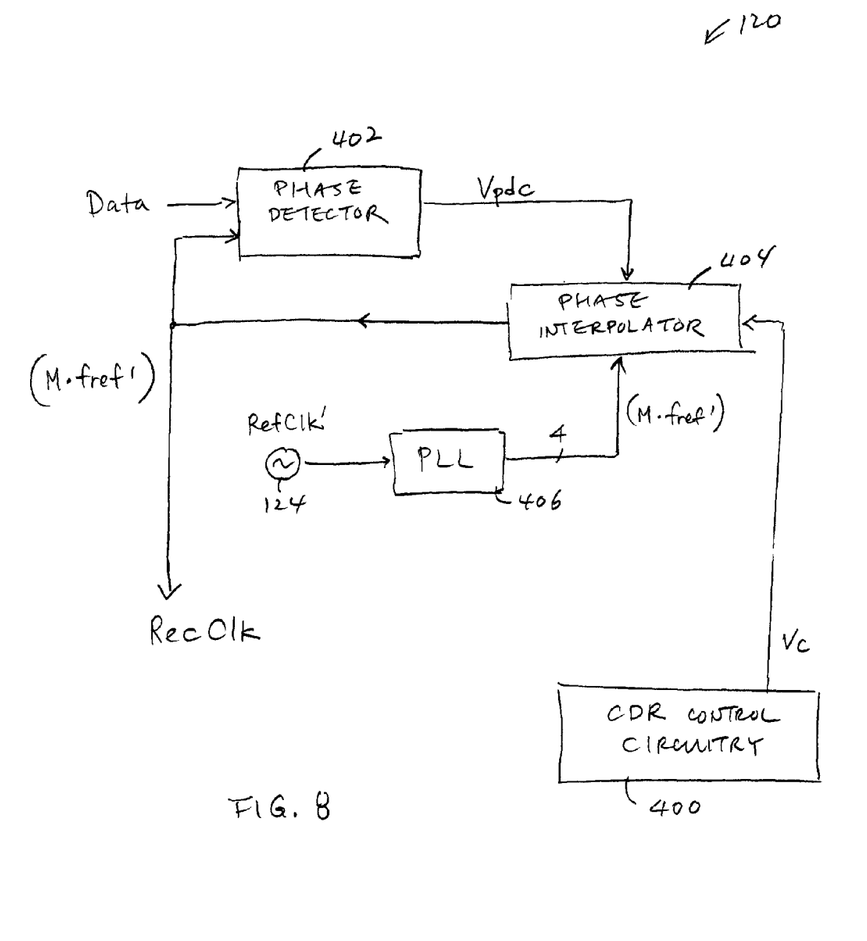
FIG. 8 is a diagram of illustrative digital clock data recovery circuitry in accordance with an embodiment of the present invention.

FIG. 8 shows another suitable arrangement of CDR circuitry 120 (data latching circuitry and offset calibration circuitry are not shown). As shown in FIG. 8, circuitry 120 may include a phase detector (PD) circuit such as PD 402, a phase interpolating (PI) circuit such as phase interpolator 404, a phase-locked loop (PLL) circuit such as PLL 406, and CDR control circuitry 400. Clock data recovery circuitry 400 is sometimes considered to be separate from CDR circuitry 120.

Phase-looked loop 406 may receive RX reference clock signal RefClk' from clock source 124. In the example of FIG. 8, PLL 406 may be used to output four different clock signals with a frequency that is equal to the frequency of RefClk' multiplied by factor M (e.g., the frequency of the four different clock signals may be equal to M*fref').

For example, PLL 406 may output a first clock signal that is aligned to RefClk' (i.e., the first clock signal includes clock edges that are aligned to clock edges of RefClk'), a second clock signal having a 90° phase offset with respect to the first clock signal, a third clock signal having a 180° phase offset with respect to the first clock signal, and a fourth clock signal having a 270° phase offset with respect to the first clock signal. If desired, PLL 406 may be used to generate eight clock signals with different phases, 16 clock signals with different phases, 32 clock signals with different phases, or any suitable number of clock signals with any amount of phase offset with respect to one another.

Phase interpolator 404 may have an input that receives the different clock signals from PLL 406 and an output. Phase interpolator 404 may be configured to generate at its output a corresponding clock signal that is interpolated from any pair of clock signals received at its input. Phase detector 402 may have a first input that receives data bits Data from receiver 118 (FIG. 1), a second input that is coupled to the output of phase interpolator 404, and an output on which a phase detector control signal Vpdc is provided. Phase detector 402 may serve to compare only the phases of the signals presented at its first and second inputs and to generate Vpdc at its output to adjust phase interpolator 404 accordingly (e.g., in steady state, phase detector 402 will output a control signal Vpdc to control phase interpolator 404 so that phase interpolator 404 outputs an interpolated clock signal having a frequency that is equal to M*fref' and that is phase aligned to Data).

The interpolated clock signal generated in this way may therefore be used as the recovered clock signal RecClk. Phase detector 402 and phase interpolator 404 coupled in a closed loop using this arrangement may sometimes be referred to collectively as a delay-locked loop (DLL). In general, phase interpolator 404 is implemented as a digital circuit block. Clock data recovery circuitry 120 of this type is therefore sometimes referred to as a DLL-based, phase-interpolator-based, or "digital" CDR circuitry.

Implementing bit swapping for digital CDR circuitry may require less hardware than the analog CDR architecture. For example, the data latching circuitry that is used in conjunction with digital CDR circuitry 120 of the type described in connection with FIG. 8 need not include any clock swapping multiplexers (i.e., multiplexers 306 and 308 of FIG. 7).

The bit swapping capability may be implemented by directly adjusting the phase of RecClk via control of phase interpolator 404. As shown in FIG. 8, CDR control circuitry 400 may output a control signal Vc to phase interpolator 404. Control signal Vc may be driven low during a first (non-swapped) clocking mode. During the first clocking mode, signal RecClk represents the default signal that is set initially by the delay-locked loop upon device startup. Control signal Vc may be driven high during a second (swapped) clocking mode. During the second clocking mode, the asserted Vc may configure phase interpolator 404 to delay RecClk by a 180° (e.g., by inverting the default RecClk). Inverting RecClk in this way is effectively equal to rerouting the clock signals so that the even and odd data latching circuits switch the bits that are being captured. An eye quality monitoring circuit may similarly be used by the data latching circuitry to obtain link performance measurements during the first and second clocking modes to determine which one of the first or second clocking modes in which receiver circuitry 104 should operate.

Figure 9:
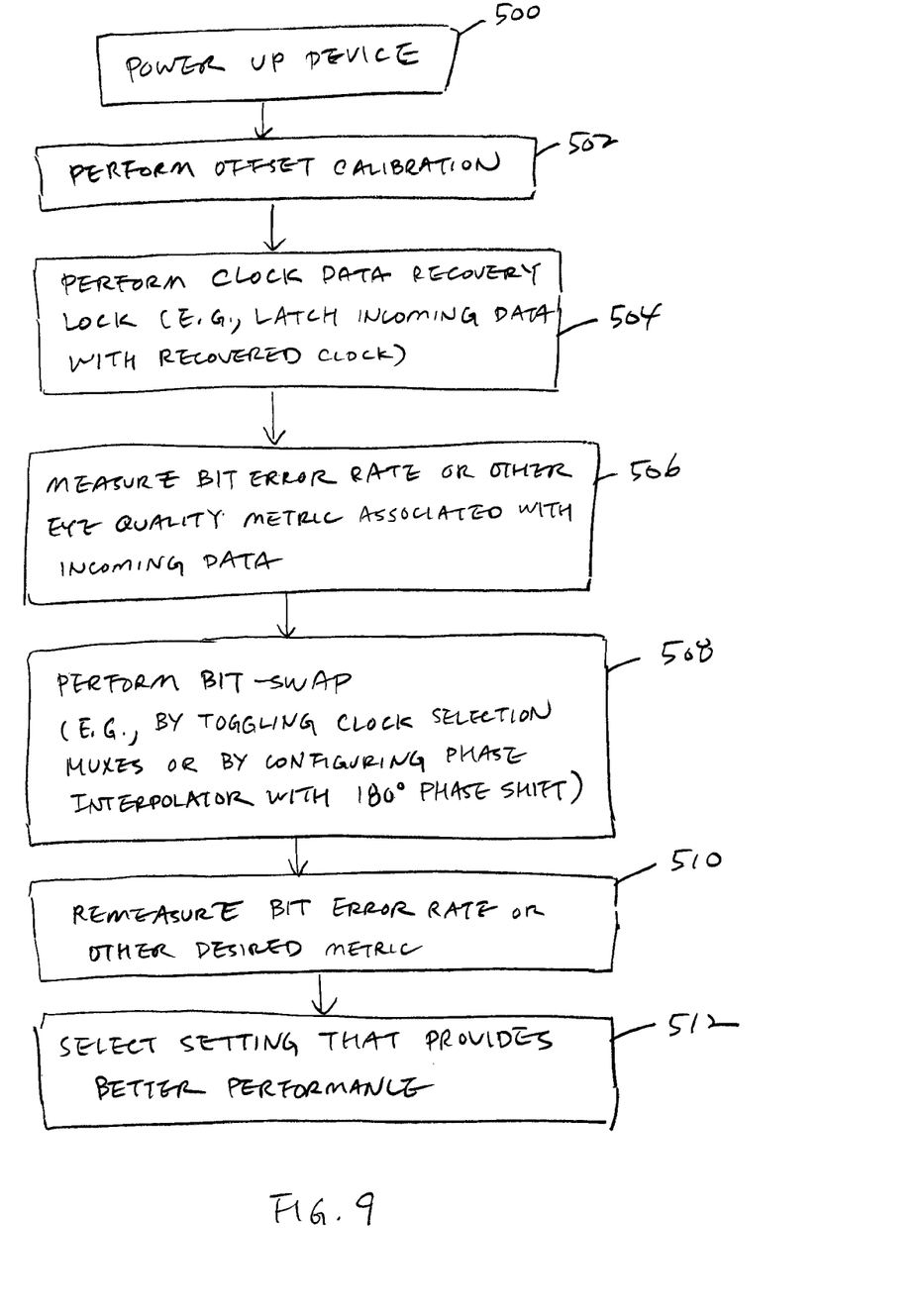
FIG. 9 is a flow chart of illustrative steps involved in performing bit swapping for improving data transmission performance in accordance with an embodiment of the present invention.

FIG. 9 shows illustrative steps involved in performing bit swapping in CDR circuitry. At step 500, an integrated circuit device such as receiver circuitry 104 may be powered up. At step 502, offset calibration may be performing using offset calibration circuitry 298 to remove any preexisting data latch offset (e.g., residual latch voltage offset may still remain after offset cancelation).

At step 504, an initial clock data recovery lock may be performed by latching incoming data bits with the default recovered clock. At step 506, eye quality monitoring circuit 318 may be used to measure the bit error rate (BER) or other eye quality metric associated with the incoming data bits.

At step 508, bit swap (sometimes referred to as clock inversion) may be performed. In scenarios in which receiver circuitry 104 includes analog CDR circuitry of the type described in connection with FIGS. 6 and 7, CDR control circuitry 300 may toggle control signal Vc to configure multiplexers 306 and 308 to reroute RecClk. In scenarios in which receiver circuitry 104 includes digital CDR circuitry of the type described in connection with FIG. 8, CDR control circuitry 400 may toggle control signal Vc to configure phase interpolator 404 with an additional 180° phase shift (i.e., to invert RecClk).

At step 510, the incoming data bits may be latched using the "rerouted" or "inverted" recovered clock. At this step, eye quality monitoring circuit 318 may again be used to measure the bit error rate (BER) or other eye quality metric associated with the incoming data bits.

At step 512, the CDR control circuitry may compare the BER measured during step 506 with the BER measured during step 510 to determine which setting that CDR circuitry 120 should be operating. The setting that yields the better BER or the better link performance measurement should be selected.

The embodiments thus far have been described with respect to integrated circuits. The methods and apparatuses described herein may be incorporated into any suitable circuit. For example, the techniques described herein may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EEPLDs), electrically erasable programmable logic devices (EEPLDs), logic cell arrays (LCAs), complex programmable logic devices (CPLDs), and field programmable gate arrays (FPGAs), just to name a few. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an integrated circuit that receives incoming data bits, comprising:
   using a data latch to capture the incoming data bits with a clock signal while the integrated circuit is placed in a first clocking mode;
   using the data latch to capture the incoming data bits with an inverted version of the clock signal while the integrated circuit is placed in a second clocking mode;
   using a multiplexer to receive the clock signal and the inverted version of the clock signal, to route the clock signal to the data latch during the first clocking mode, and to route the inverted version of the clock signal to the data latch during the second clocking mode;
   using an additional multiplexer to receive the clock signal and the inverted version of the clock signal, to route the inverted version of the clock signal to an output of the additional multiplexer during the first clocking mode, and to route the clock signal to the output of the additional multiplexer during the second clocking mode;
   comparing first data latching performance obtained during the first clocking mode with second data latching performance obtained during the second clocking mode; and
   selecting only one of the first and second clocking modes for use during normal operation of the integrated circuit as a function of the comparison.

2. The method defined in claim 1, further comprising:
   with clock data recovery circuitry, generating the clock signal that is used in latching the incoming data bits, wherein the clock signal comprises a recovered clock signal.

3. The method defined in claim 2, further comprising:
with the data latch, latching even data bits in the incoming data bits during the first clocking mode and latching odd data bits in the incoming data bits during the second clocking mode; and
with an additional data latch, latching the odd data bits during the first clocking mode and latching the even data bits during the second clocking mode.

4. The method defined in claim 3, wherein the clock data recovery circuitry includes a phase-locked loop that is coupled to a phase detector, and wherein generating the recovered clock signal comprises generating the recovered clock signal using the phase-locked loop and the phase detector.

5. The method defined in claim 1, further comprising:
using data bit reordering circuitry to swap an order of the data bits latched by the data latch and the additional data latch.

6. The method defined in claim 3, wherein the clock data recovery circuitry includes a phase interpolator that is coupled to a phase-locked loop and a phase detector, and wherein generating the recovered clock signal comprises generating the recovered clock signal using the phase interpolator, the phase-locked loop, and the phase detector.

7. The method defined in claim 6, further comprising:
with control circuitry, configuring the phase interpolator to output the clock signal during the first clocking mode and configuring the phase interpolator to output the inverted version of the recovered clock signal during the second clocking mode.

8. The method defined in claim 7, wherein configuring the phase interpolator to output the inverted version of the clock signal comprises applying a 180° phase delay to the clock signal.

9. A method of operating an integrated circuit that receives data bits, comprising:
during a first time period, latching the data bits using a first clock signal;
during a second time period, latching the data bits using a second clock signal that is different than the first clock signal;
obtaining a first performance metric during the first time period and obtaining a second performance metric during the second time period;
with control circuitry, comparing the first performance metric with the second performance metric;
in response to determining that the first performance metric is greater than the second performance metric, using the first clock signal to latch incoming data bits during normal operation of the integrated circuit; and
in response to determining that the second performance metric is greater than the first performance metric, using the second clock signal to latch incoming data bits during normal operation of the integrated circuit.

10. The method defined in claim 9, further comprising:
with clock data recovery circuitry, generating the first clock signal that is used in latching the data bits.

11. The method defined in claim 10, wherein the second clock signal comprises an inverted version of the first clock signal.

12. The method defined in claim 10, wherein obtaining the first and second performance metrics comprises obtaining bit error rate (BER) measurements using an eye quality monitoring circuit.

13. The method defined in claim 10, wherein latching the data bits during the first and second time periods comprises capturing the data bits with data latching circuitry, the method further comprising:
with offset calibration circuitry, performing voltage offset cancelation on the data latching circuitry.

14. An integrated circuit operable to receive incoming data bits, comprising:
clock data recovery circuitry that receives the incoming data bits and generates a corresponding recovered clock signal; and
data latching circuitry that is clocked by the recovered clock signal during a first time period and that is clocked by an inverted version of the recovered clock signal during a second time period that is different than the first time period, wherein the data latching circuitry comprises:
first and second data latching circuits;
a first multiplexer configured to route the recovered clock signal to the first data latching circuit during the first time period and to route the inverted version of the recovered clock signal to the first data latching circuit during the second time period; and
a second multiplexer configured to route the inverted version of the recovered clock signal to the second data latching circuit during the first time period and to route the recovered clock signal to the second data latching circuit during the second time period.

15. The integrated circuit defined in claim 14, further comprising:
offset calibration circuitry coupled to the data latching circuitry, wherein the offset calibration circuitry performs voltage offset cancelation on the data latching circuitry.

16. The integrated circuit defined in claim 14, wherein the data latching circuitry further comprises:
data bit reordering circuitry that is coupled to the first and second data latching circuits and that is used to reorder data bits that have been captured by the first and second data latching circuits.

17. The integrated circuit defined in claim 14, wherein the clock data recovery circuitry comprises:
a phase interpolator that receives a control signal, wherein the phase interpolator outputs the recovered clock signal when the control signal has a first value, and wherein the phase interpolator outputs the inverted version of the recovered clock signal when the control signal has a second value that is different than the first value.

18. The integrated circuit defined in claim 14, wherein the data latching circuitry further comprises:
monitoring circuitry configured to obtain link performance measurements on the incoming data bits that are being latched by the data latching circuitry.

19. method defined in claim 1, wherein selecting only one of the first and second clocking modes for use during normal operation of the integrated circuit comprises selecting the first clocking mode in response to the comparison producing a first result and selecting the second clocking mode in response to the comparison producing a second result that is different than the first result.

20. The method defined in claim 1, further comprising:
using an additional data latch to receive the inverted version of the clock signal from the output of the additional multiplexer during the first clocking mode; and using the additional data latch to receive the clock signal from the output of the additional multiplexer during the second clocking mode.

* * * * *